United States Patent
Ohara et al.

(10) Patent No.: US 12,238,874 B2
(45) Date of Patent: Feb. 25, 2025

(54) ELECTRIC DEVICE

(71) Applicant: Mitsubishi Electric Corporation, Tokyo (JP)

(72) Inventors: Takashi Ohara, Tokyo (JP); Kazuhisa Tamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 368 days.

(21) Appl. No.: 17/892,579

(22) Filed: Aug. 22, 2022

(65) Prior Publication Data
US 2023/0122791 A1    Apr. 20, 2023

(30) Foreign Application Priority Data

Oct. 15, 2021    (JP) .................................. 2021-169314

(51) Int. Cl.
| | |
|---|---|
| *H05K 5/00* | (2006.01) |
| *H01R 12/71* | (2011.01) |
| *H01R 13/52* | (2006.01) |
| *H05K 7/14* | (2006.01) |

(52) U.S. Cl.
CPC ......... *H05K 5/0069* (2013.01); *H01R 12/716* (2013.01); *H01R 13/5202* (2013.01); *H05K 7/1427* (2013.01)

(58) Field of Classification Search
CPC .. H05K 5/0069; H05K 7/1427; H01R 12/716; H01R 13/5202
USPC ......................................................... 439/76
See application file for complete search history.

(56) References Cited

U.S. PATENT DOCUMENTS

| | | | | |
|---|---|---|---|---|
| 8,770,989 | B2* | 7/2014 | Ohhashi | H05K 5/0069 |
| | | | | 439/589 |
| 8,942,001 | B2* | 1/2015 | Kawai | H05K 5/0052 |
| | | | | 361/728 |
| 9,197,002 | B2* | 11/2015 | Satoh | H01R 13/516 |
| 9,281,607 | B2* | 3/2016 | Lee | H01R 13/5202 |
| 9,775,256 | B2* | 9/2017 | Garcia | H05K 5/0052 |
| 9,814,147 | B2* | 11/2017 | Igari | H05K 5/0069 |
| 10,630,150 | B2* | 4/2020 | Tsuboi | H02K 5/10 |
| 10,986,723 | B2* | 4/2021 | Johnson | H05K 1/186 |
| 11,147,173 | B2* | 10/2021 | Ooue | H05K 5/0052 |
| 11,199,878 | B2* | 12/2021 | Huang | G06F 1/16 |
| 11,284,529 | B2* | 3/2022 | Jung | H02M 3/003 |

(Continued)

FOREIGN PATENT DOCUMENTS

JP            6542642 B2    7/2019

*Primary Examiner* — Alexander Gilman
(74) *Attorney, Agent, or Firm* — Sughrue Mion, PLLC

(57) ABSTRACT

The electric device has a first seal part, including, between a first case and a second case, a groove portion prepared at one side and a projection portion prepared at another side, where those portions are joined by sealing material; a second seal part, including, between the opening part of the first case and a peripheral part of the connector, a groove portion prepared at one side and a projection portion prepared at another side, where those portions are joined by the sealing material; and a third seal part, including, among the first case, the second case, and the peripheral part of the connector, a groove portion prepared at one side and a projection portion prepared at another side, as a combination, or a projection portion prepared at one side and a groove portion prepared at another side, as a combination, where those portions are joined by the sealing material.

16 Claims, 6 Drawing Sheets

(56) References Cited

U.S. PATENT DOCUMENTS

| | | | |
|---|---|---|---|
| 11,404,931 B2* | 8/2022 | Nakamura | H02K 5/08 |
| 11,858,434 B2* | 1/2024 | Lee | B60R 16/0239 |
| 11,997,812 B2* | 5/2024 | Fine | H05K 5/061 |
| 12,075,574 B2* | 8/2024 | Tanaka | H05K 7/1405 |
| 2007/0249223 A1* | 10/2007 | Sakamoto | H01R 13/5221 |
| | | | 439/552 |
| 2011/0211311 A1* | 9/2011 | Shinoda | H05K 5/0213 |
| | | | 361/694 |
| 2012/0069532 A1* | 3/2012 | Azumi | H05K 5/0069 |
| | | | 361/752 |
| 2012/0127677 A1* | 5/2012 | Wakana | H05K 5/0069 |
| | | | 361/752 |
| 2012/0315779 A1* | 12/2012 | Yudate | H01R 13/5202 |
| | | | 439/271 |
| 2012/0320544 A1* | 12/2012 | Ohhashi | H05K 5/0052 |
| | | | 361/752 |
| 2013/0069320 A1* | 3/2013 | Yanagisawa | H05K 5/0082 |
| | | | 277/628 |
| 2013/0120943 A1* | 5/2013 | Tamura | H05K 5/0039 |
| | | | 361/752 |
| 2013/0271933 A1* | 10/2013 | Tanaka | H05K 5/0052 |
| | | | 361/752 |
| 2014/0080329 A1* | 3/2014 | Yamanaka | H05K 7/14 |
| | | | 439/76.1 |
| 2014/0307399 A1* | 10/2014 | Tamura | H05K 5/0039 |
| | | | 361/752 |
| 2015/0244097 A1* | 8/2015 | Hirayama | G01L 19/0084 |
| | | | 439/660 |
| 2015/0244099 A1* | 8/2015 | Lee | H01R 13/508 |
| | | | 439/660 |
| 2015/0367790 A1* | 12/2015 | Cheng | B60R 16/0215 |
| | | | 439/587 |
| 2016/0128208 A1* | 5/2016 | Bolik | H05K 5/061 |
| | | | 361/709 |
| 2016/0165736 A1* | 6/2016 | Tsuboi | H02K 11/33 |
| | | | 174/50.54 |
| 2017/0112004 A1* | 4/2017 | Takamatsu | H01R 13/5202 |
| 2018/0109027 A1* | 4/2018 | Kaneko | H05K 5/069 |
| 2018/0192526 A1* | 7/2018 | Suzuki | H05K 5/0052 |
| 2019/0380220 A1* | 12/2019 | Matsuda | H05K 5/0213 |
| 2019/0386431 A1* | 12/2019 | Sato | B60R 16/03 |
| 2020/0076118 A1* | 3/2020 | Tada | H01R 13/73 |
| 2020/0367372 A1* | 11/2020 | Ooue | H05K 5/0056 |
| 2023/0122791 A1* | 4/2023 | Ohara | H05K 5/0069 |
| | | | 361/752 |

* cited by examiner

ELECTRIC DEVICE

FIELD OF THE INVENTION

The present application relates to the field of an electronic device which seals and holds, in a housing, a substrate and a part of the connector, connected to the substrate.

DESCRIPTION THE RELATED ART

An electronic device is generally known, in which a circuit board is stored in a housing, and a connector is connected to the circuit board through an opening part of the housing from the outside, where electronic components are mounted on the circuit board, and the housing consists of a pair of cases. Moreover, the structure of an electronic device is known in which, between paired cases and between the opening part of a housing and a connector, spacings of maze like shape are formed by grooves and projections, and the waterproof property is improved by filling sealing material in the spacings. (For example, refer to Patent Document 1)

CITATION LIST

Patent Literature

Patent Document 1: Japanese Patent No. 6542642

SUMMARY OF THE INVENTION

Technical Problem

In the case of such an electronic device, electronic components and circuits are mounted on a substrate, and cases are in pairs. The process of applying sealing material between the cases, when storing the substrate in a housing, and the following process of applying the sealing material, when connecting the housing and a connector, are different processes. Then, the production processes become complicated. Moreover, in order to apply to a mass-production production line which manufactures a plurality of electronic devices in a short time, seal application machines as many as seal application processes are needed. Thereby, there is concern that the cost which is required for manufacturing equipment may increase.

Moreover, when a seal part between the cases and a seal part between a case and a connector are lined up side-by-side, and seal application processes are performed in the same process, another problem arises. That is, it is commonly done to arrange a connector at the end portion of the substrate, by the layout restrictions of the electronic components and the circuit pattern which are mounted on the substrate. In the peripheral part of a housing, the case seal part between cases, and the connector seal part between a connector and a case opening part are lined up side-by-side. Therefore, in the seal part of the housing peripheral part, needed is the width size which is the total of two groove widths of the case seal part and the connector seal part, and the width of a partition use wall which separates each of the groves. Moreover, due to waterproofing performance, a groove width requires a maze-like spacing which is filled up with sealing material, around a projection. Furthermore, for forming processing, the partition use wall which separates the projection and each of the grooves needs the material thickness for raising intensity. Therefore, the reduction of the width size of a housing could not be achieved unfortunately.

The present application is made in order to solve the subjects mentioned above, and aims at offering an electronic device which can achieve the improvement in manufacturing efficiency due to the reduction in the number of processes in the seal application process, and can down size the outside of the device.

Solution to Problem

An electronic device, according to the present application, includes
- a substrate,
- a connector connected to the substrate,
- a first case which has an opening part, exposing a part of the connector to an outside, and
- a second case which is joined with the first case, and seals and holds, inside a housing, a part of the connector and the substrate, wherein the electric device has
- a first seal part, including, between the first case and the second case, a groove portion prepared at one side and a projection portion prepared at another side, where those portions are joined by sealing material;
- a second seal part, including, between the opening part of the first case and a peripheral part of the connector, a groove portion prepared at one side and a projection portion prepared at another side, where those portions are joined by the sealing material; and
- a third seal part, including, among the first case, the second case, and the peripheral part of the connector, a groove portion prepared at one side and a projection portion prepared at another side, as a combination, or a projection portion prepared at one side and a groove portion prepared at another side, as a combination, where those portions are joined by the sealing material, further wherein the first seal part, the second seal part, and the third seal part are connected.

Advantageous Effects of Invention

According to the present application, there is provided with the first seal part, where, between the first case and the second case, a groove portion prepared at one side of the cases and a projection portion prepared at the other side are joined by sealing material; the second seal part, where, between the opening part of the first case and the peripheral part of a connector, a groove portion prepared at one side of the parts and a projection portion prepared at the other side are joined by sealing material; and the third seal part, where, among the first case, the second case and the peripheral part of the connector, a groove portion prepared at one side and a projection portion prepared at the other side as a combination, or a projection portion prepared at one side and a groove portion prepared at the other side as a combination are joined by sealing material. Those seal parts are connected mutually, and then, the sealing material can be applied at the same process. Moreover, the electronic device employs the structure where, in the third seal part, among the first case, the second case, and the peripheral part of a connector, a groove portion prepared at one side and a projection portion prepared at the other side as a combination, or a projection portion prepared at one side and a groove portion prepared at the other side as a combination are sealed as a whole by sealing material. Thereby, the reduction in the seal width can be achieved. Therefore, in the constitution in which a connector is connected to a substrate end, it becomes possible to suppress the breadth of a housing, and reduce the outside diameter of the device.

DESCRIPTION OF THE PREFERRED EMBODIMENTS

Embodiment 1

Figure 1:
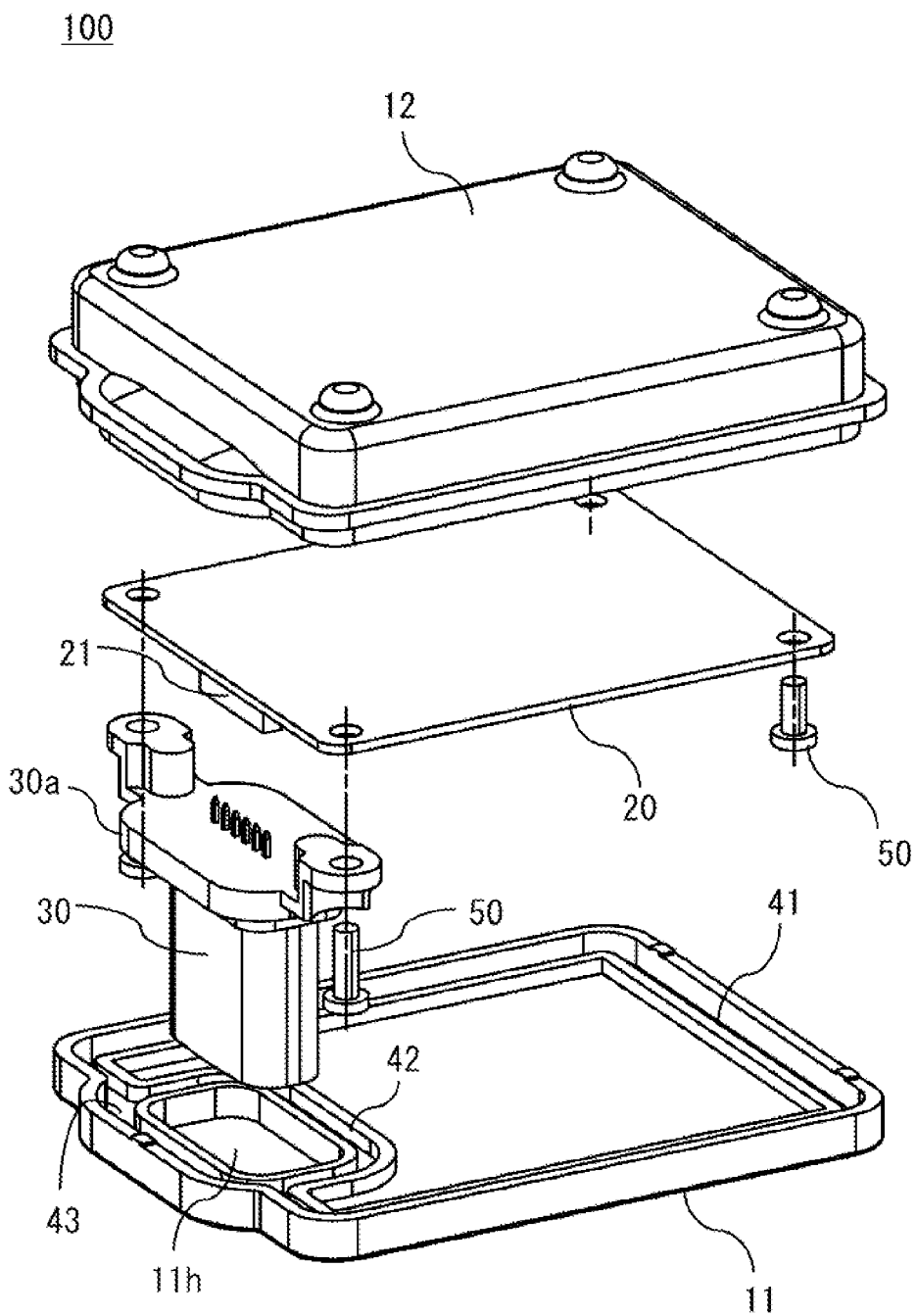
FIG. 1 is a perspective diagram which shows a disassembled state of the electronic device according to the Embodiment 1.
Figure 2A:
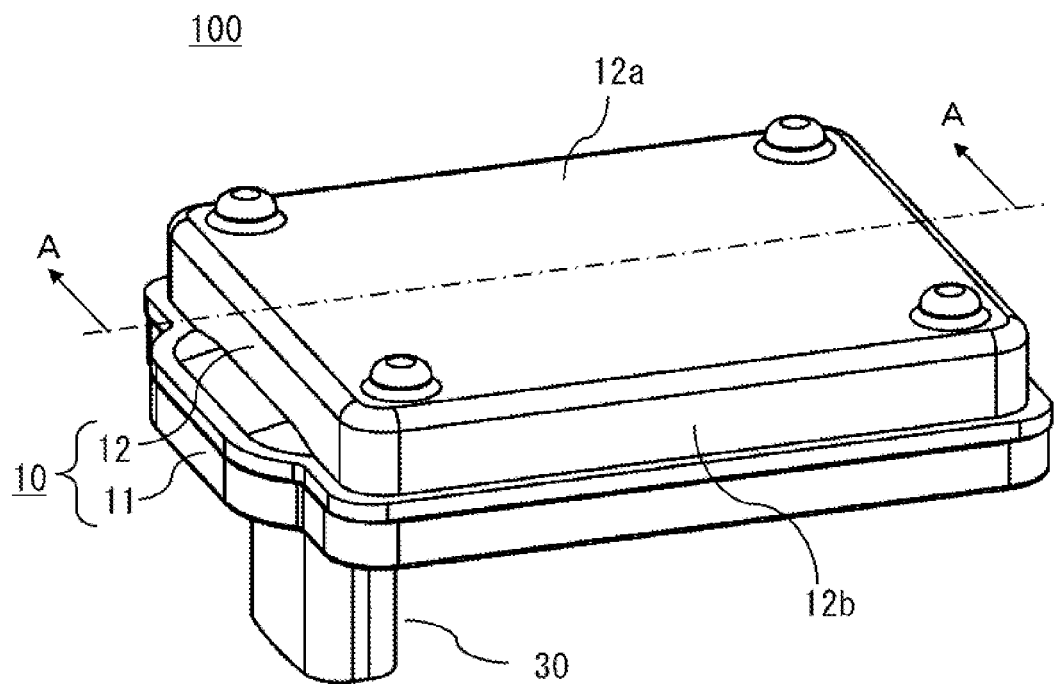
FIG. 2A is a perspective diagram which shows an upper surface of the electronic device according to the Embodiment 1.

Hereinafter, explanation will be made about the Embodiment 1 of the present application. In the Embodiments of the present application, an electronic device which is applied to an in-vehicle radar is explained, as an example. FIG. 1 shows a perspective diagram in the state where the whole electronic device 100 is decomposed into composition articles. FIG. 2A is a perspective diagram of the assembled electronic device 100, and FIG. 2B is a perspective diagram in which the electronic device 100 is placed upside down.

Figure 2B:
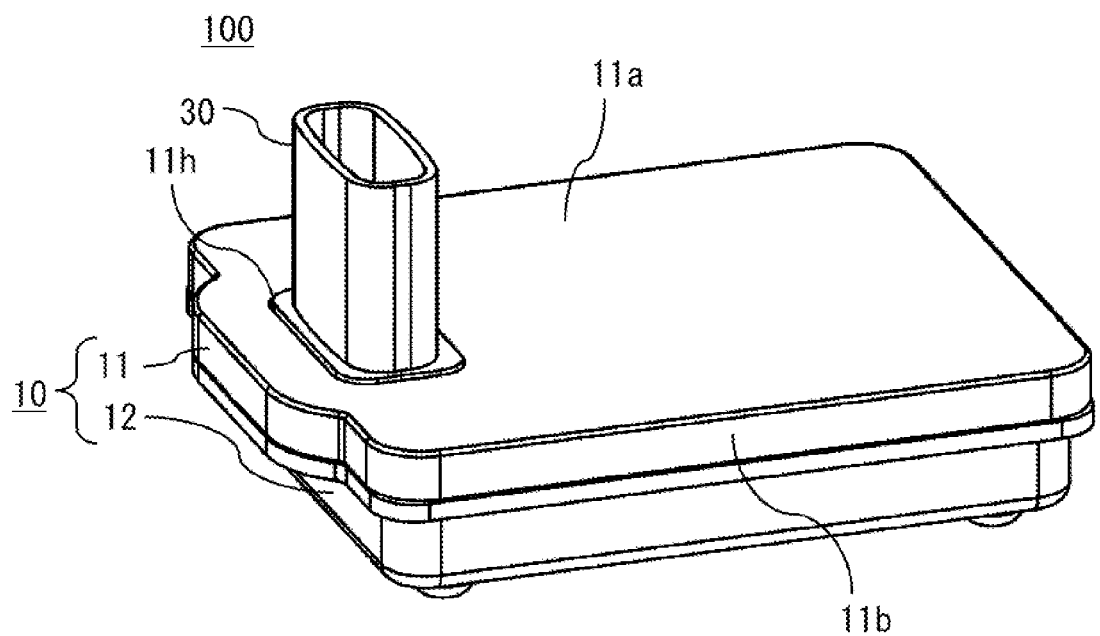
FIG. 2B is a perspective diagram which shows a lower surface of the electronic device according to the Embodiment 1.

As shown in FIG. 1, FIG. 2A, and FIG. 2B, the electronic device 100 is equipped with a substrate 20 on which electronic components for controlling a radar, and electronic circuits by an antenna, etc. are mounted, a connector 30 which is connected to the substrate 20, and a housing 10 which seals and holds the substrate 20 and the connector 30, while a part of the connector 30 is exposed to the outside.

The housing 10 consists of a first case 11 which is die-cast formed from the metal with a high thermal conductivity, such as aluminum, and a second case 12 which is formed from the resin material, penetrating radar waves, such as PBT or PPS. The first case 11 is almost in the shape of plate, having a sole plate part 11a and a peripheral wall part 11b in its surrounding, and the second case 12 is almost in the shape of a box, having a top plate part 12a and a peripheral wall part 12b in its surrounding. The first case 11 and the second case 12 are mutually combined to form an accommodation space. The substrate 20 and a part of the connector 30 are stored in the space. The first case 11 has an opening part 11h, which exposes an external connection part of the connector 30 to the outside.

The substrate 20 is fixed to the second case 12 with screws 50. Together with the substrate 20, the connector 30 is fixed to the second case 12 with screws 50. Moreover, a terminal 31 of the connector 30 and the substrate 20 are electrically connected with a relay socket 21, which is prepared at the end part of the substrate 20.

Figure 3:
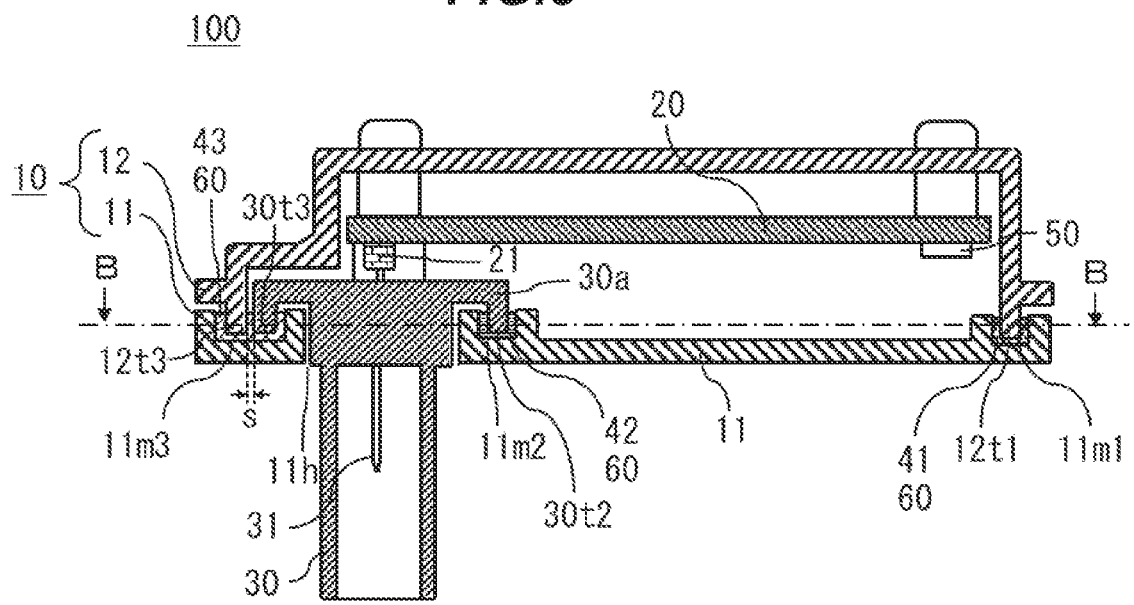
FIG. 3 is a sectional view which shows an electronic device according to the Embodiment 1.
Figure 4:
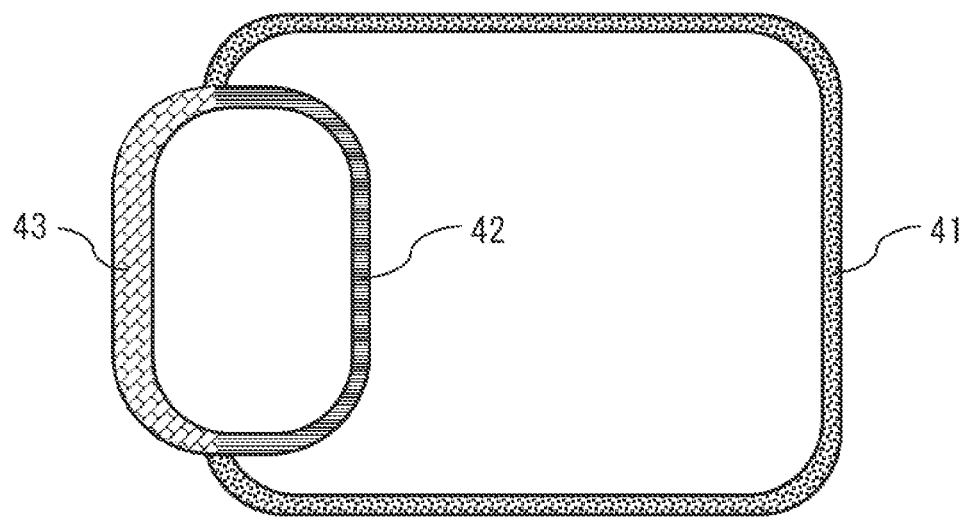
FIG. 4 is a schematic diagram which shows the arrangement of a seal part of the electronic device according to the Embodiment 1.

FIG. 3 is a sectional view which shows the A-A section of FIG. 2A. In FIG. 3, in each of the peripheral parts of the first case 11 and the second case 12, a first seal part 41 is formed, which consists of a groove portion and a projection portion, which will be joined together. Moreover, in the peripheral part 30a of the external exposure part of the connector 30, and in the peripheral part of the opening part 11h of the first case 11, a second seal part 42 is formed, which consists of a groove portion and a projection portion which will be joined together. Furthermore, the groove portions of the first seal part 41 and the second seal part 42 are connected together, and in addition, a third seal part 43 is formed which is joined to the groove portions and projection portions of the first case 11, the second case 12, and the peripheral part 30a of the connector 30. FIG. 4 is a schematic diagram by the B-B section of FIG. 3 and shows the arrangement of these seal parts. The first seal part 41, the second seal part 42, and the third seal part 43 are connected continuously, and between the groove portion and the projection portion of each of these seal parts, the sealing material 60 of silicon series, such as humidity hardening type, is filled up. This sealing material becomes adhesives, and these seal parts are united mutually and joined together. In this way, the waterproofing structure of the electronic device 100 is formed.

Explanation will be made about the effect of this configuration. While the connector 30 is connected to the substrate 20, each of the cases is assembled. In this situation, sealing material can be applied, at the same process, to each of the seal parts, between both cases and between a connector and a case. Moreover, since each of the seal parts is connected continuously, sealing material application to each of the seal parts can be continuously carried out, by a single application work, so as to allow a single stroke writing. Therefore, the efficiency of the seal application process can be improved.

Moreover, as shown in FIG. 4, the first seal part 41, the second seal part 42, and the third seal part 43 are arranged almost on the same plane. The sealing material 60 is liquid like, shortly after the application of the sealing material to a groove and before curing. As an effect of this arrangement, the liquid like sealing material 60 can flow down on the inclined surface inside the groove. Thereby, it becomes possible to avoid the partial insufficient filling of the sealing material inside the groove. Therefore, the waterproof performance can be improved.

Further, with respect to the sum total width in which the first seal part 41 and the second seal part 42, which are formed by the groove portion and the projection portion, are separated by the wall for separation, and are arranged in parallel, the third seal part 43, which is connected with the first seal part and the second seal part and consists of a groove portion and a projection portion, has a maze like spacing formed by a projection portion and a groove portion, in which sealing material required for the waterproofing is filled up, and in addition, can eliminate the wall for the partition. Thereby, seal width can be reduced. Therefore, in the configuration where the connector 30 is connected to the end part of the substrate 20, it becomes possible to suppress the breadth of the housing 10, and further reduce the size of the electronic device 100.

Moreover, in FIG. 3, the first seal part 41 is formed of a substantially U shaped groove portion 11m1 which consists of a part of the first case 11, and a substantially U shaped projection portion 12t1 which consists of a part of the second case 12. The second seal part 42 is formed of a substantially U shaped groove portion 11m2 which consists of a part of the first case 11, and a substantially U shaped projection portion 30t2 which consists of a part of the peripheral part 30a of the connector 30. The third seal part 43 is formed of a substantially U shaped groove portion 11m3 which consists of a part of the first case 11, a substantially U shaped projection portion 12t3 which consists of a part of the second case 12, and a substantially U shaped projection portion 30t3 which consists of a part of the peripheral part 30a of the connector 30. Each of the groove portions is joined with each of the projection portions, having the sealing material in between, and a seal part is formed.

As an effect by this configuration, the third seal part 43 has a maze like spacing formed by the projection portions 12t3 and 30t3 and the groove portion 11m3, into which the sealing material 60 required for the waterproofing is filled up, and in addition, the spacing between the projection portion 12t3 and the projection portion 30t3 can be as narrow as the minimum spacing width s, which is required for assembling. Thereby, the full width of the groove portion 11m3 can be reduced. Therefore, it becomes possible to suppress the breadth of the housing 10, and further reduce the size of the electronic device 100.

Embodiment 2

Figure 5:
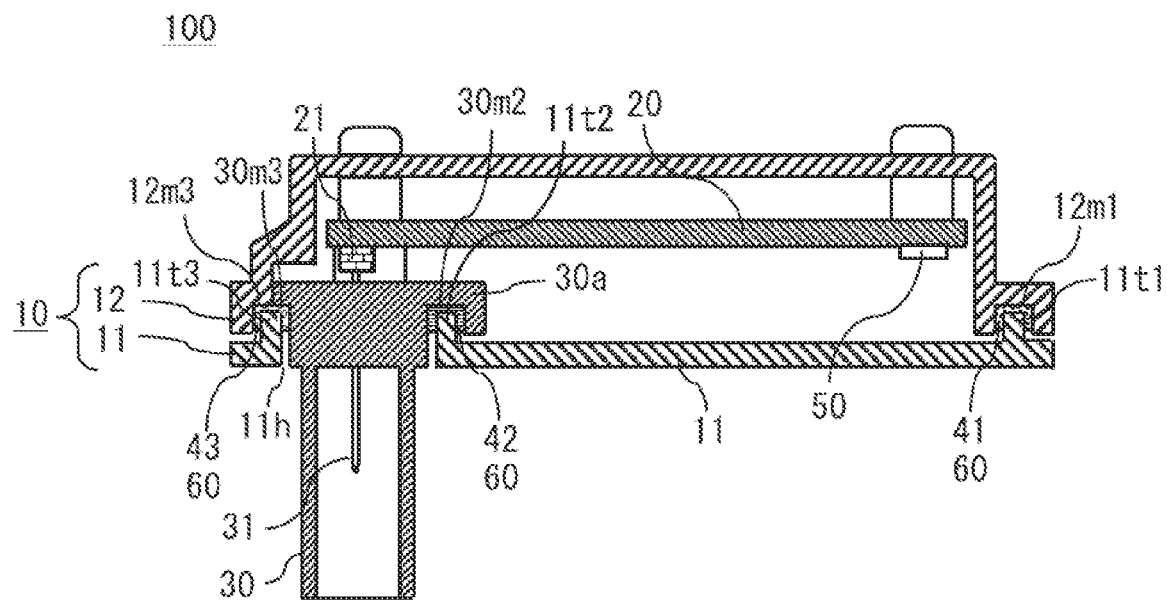
FIG. 5 is a sectional view which shows the electronic device according to the Embodiment 2.

In FIG. 5, shown is a sectional view of the electronic device 100 according to the Embodiment 2. As for the component parts explained in the Embodiment 1, the same numeral is given to the same portion, and explanation is omitted. The component part which is changed in the Embodiment 2 is explained.

In FIG. 5, the first seal part 41 is formed of the substantially U shaped groove portion 12m1 which consists a part of the second case 12, and a substantially U shaped projection portion 11t1 which consists of a part of the first case 11. The second seal part 42 is formed of a substantially U shaped groove portion 30m2 which consist of a part of the peripheral part 30a of the connector 30, and a substantially U shaped projection portion 11t2 which consists of a part of the first case 11. As for the third seal part 43, a combined groove portion is formed of a part of a substantially L shaped groove portion 12m3 which consist of a part of the second case 12 and a part of a substantially L shaped groove portion 30m3 which consists of a part of the peripheral part 30a of the connector 30. The third seal part 43 is formed of the combined groove portion which is joined with a substantially U shaped projection portion 11t3 which consists of a part of the first case 11.

As an effect of this configuration, by being united at the projection portion 11t3 of the third seal part 43, the projection portion, as narrow as a minimum projection width, which is required for the formability and rigidity of a projection portion, can be achieved. Thereby, having a maze like spacing formed by a projection portion and a groove portion, which are filled up with sealing material required for the waterproofing, the width of a groove portion which is combined with a groove portion 12m3 and a groove portion 30m3 can be reduced. Therefore, it becomes possible to suppress the breadth of the housing 10, and further reduce the size of the electronic device 100.

Embodiment 3

Figure 6:
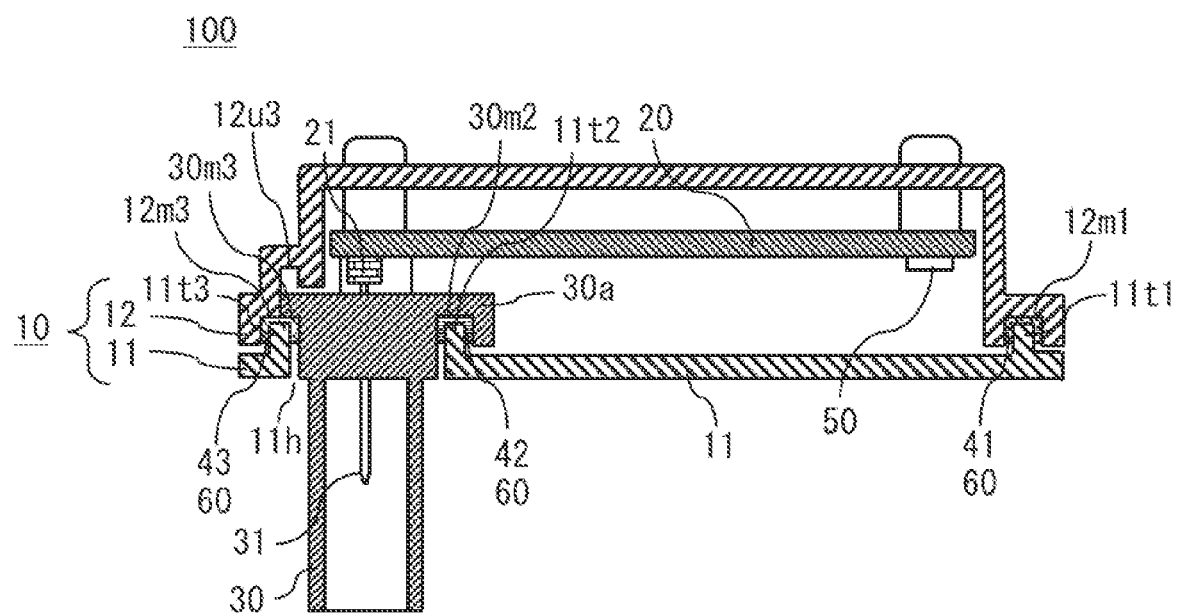
FIG. 6 is a sectional view which shows the electronic device according to the Embodiment 3.

In FIG. 6, shown is a sectional view of the electronic device 100 according to the Embodiment 3. As for the component parts explained in the Embodiments 1 and 2, the same numeral is given to the same portion, and explanation is omitted. The component part which is changed in the Embodiment 3 is explained.

In FIG. 6, the groove portion in the third seal part 43 is formed of, like in Embodiment 2, a part of a substantially L shaped groove portion 12m3 which consists of a part of the second case 12 and a part of a substantially L shaped groove portion 30m3 which consist of a part of the peripheral part 30a of the connector 30, where those groove portions are combined together. In the present Embodiment, in a part of the second case 12, at the depth part of the seamed part of these combined groove portions, at least in a part of the second case which faces a groove portion, a substantially U shaped receptacle groove 12u3 of the sealing material is prepared.

By this configuration, when the sealing material is applied, the sealing material which permeates from the boundary or the seamed part between the substantially L shaped groove portion 12m3 and groove portion 30m3, can be stored in the substantially U shaped receptacle groove 12u3 of the seal depth part. Further, the ooze of the sealing material to the outside of the housing 10 can be prevented.

Embodiment 4

Figure 7:
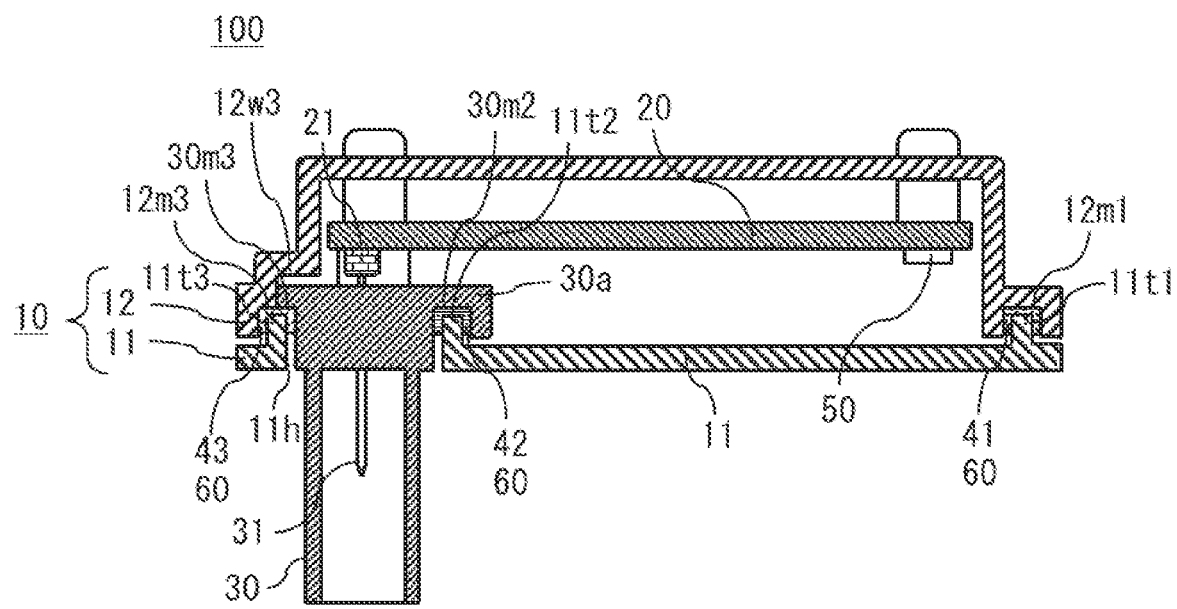
FIG. 7 is a sectional view which shows the electronic device according to the Embodiment 4.

In FIG. 7, shown is a sectional view of the electronic device 100 according to the Embodiment 4. As for the component parts explained in the Embodiments 1 to 3, the same numeral is given to the same portion, and explanation is omitted. The component part which is changed in the Embodiment 4 is explained.

In FIG. 7, the groove portion in the third seal part 43 is formed of a combined groove, like in the Embodiments 2 and 3, which is made of a part of a substantially L shaped groove portion 12m3 which consists of a part of the second case 12, and a part of a substantially L shaped groove portion 30m3 which consist of the peripheral part 30a of the connector 30. In the present Embodiment, in a part of the second case 12, that is, at the depth part of the seamed part of these combined groove portions, the substantially L shaped receptacle wall 12w3, made of the sealing material, is formed at least in a part of the second case which faces a groove portion.

When sealing material is applied, the sealing material permeates from a boundary, that is, the seamed part between a substantially L shaped groove portion 12m3 and a substantially L shaped groove portion 30m3. By this configuration, the receptacle wall 12w3 of the seal depth part can receive the permeating sealing material, and the ooze of the sealing material to the outside of the housing 10 can be prevented.

Embodiment 5

Figure 8:
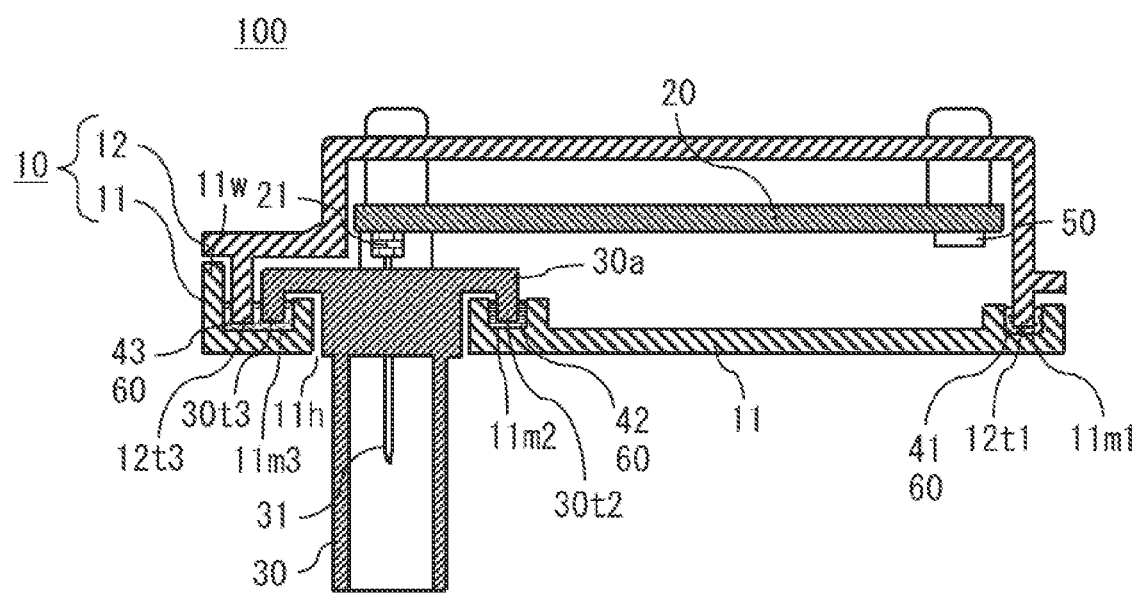
FIG. 8 is a sectional view which shows the electronic device according to the Embodiment 5.

In FIG. 8, shown is a sectional view of the electronic device 100 according to the Embodiment 5. In the present Embodiment, the structure of the third seal part 43 is changed partly from that of the Embodiment 1. As for the component parts explained in the Embodiment 1, the same numeral is given to the same portion, and explanation is omitted. The component part which is changed in the Embodiment 5 is explained.

In FIG. 8, the third seal part 43 is formed of a substantially U shaped groove portion 11m3 which consists of a part of the first case 11, a substantially U shaped projection portion 12t3 which consists of a part of the second case 12, and a substantially U shaped projection portion 30*t*3 which consists of a part of the peripheral part 30*a* of the connector 30. In the present Embodiment, in the third seal part 43, the side wall 11*w* at one side is made higher than the side wall of the other side, where the side walls form the substantially U shaped groove portion 11*m*3 which consists of a part of the first case 11.

The third seal part 43 consists of the substantially U shaped groove portion 11*m*3, and the substantially U shaped projection portions 12*t*3 and 30*t*3. Further, the third seal part consists of many component parts, as compared with the first seal part 41 and the second seal part 42. Therefore, due to the size variation of manufactured parts and the variation in the amount of applied sealing material, the overhanging of the sealing material is caused. In a case where the quantity of sealing material which is applied from a spacing is relatively large, the side wall of the groove portion 11*m*3 employs a higher height, and then, the overhanging of the sealing material can be prevented. The side wall 11*w*, at the perimeter side of the housing 10, is made longer than the side wall of the other side. Thereby, the overflowing of sealing material to the outside can be prevented, and it becomes possible to prevent the swelling of outermost form of the electronic device 100. Moreover, by adopting the side wall at the connector 30 side which is made long in size, it becomes possible to prevent the adhesion of the sealing material to the external connection part of the connector 30, and fitting affinity can be secured.

Embodiment 6

Figure 9:
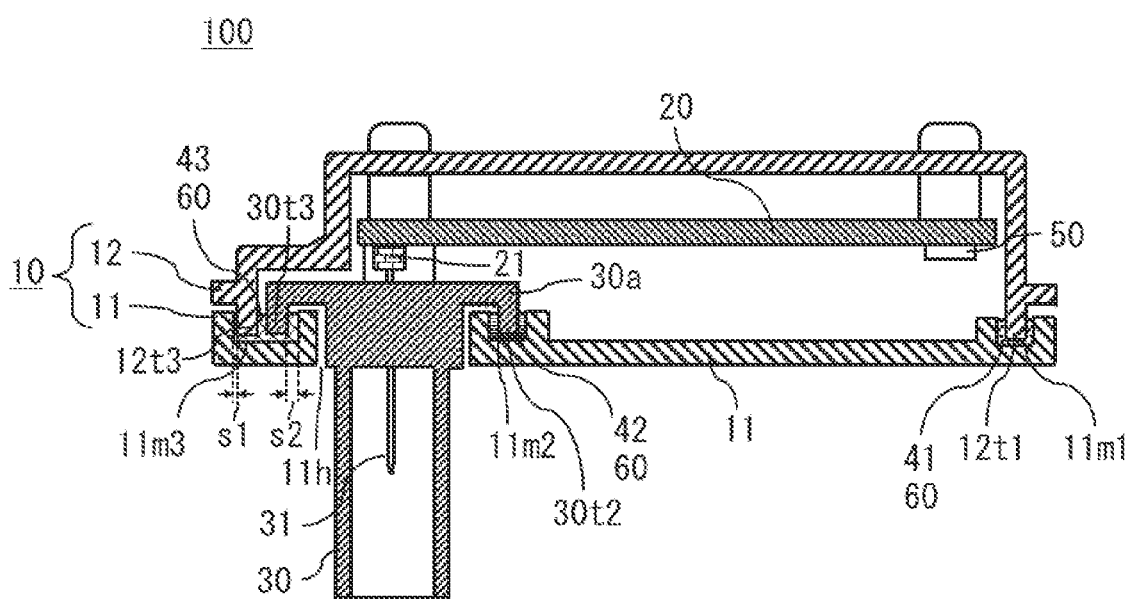
FIG. 9 is a sectional view which shows the electronic device according to the Embodiment 6.

In FIG. 9, shown is a sectional view of the electronic device 100 according to the Embodiment 6. In the present Embodiment, the structure of the third seal part 43 is changed partly from that of the Embodiment 1. As for the component parts explained in the Embodiment 1, the same numeral is given to the same portion, and explanation is omitted. The component part which is changed in the Embodiment 6 is explained.

In FIG. 9, the third seal part 43 is formed of a substantially U shaped groove portion 11*m*3 which consists of a part of the first case 11, a substantially U shaped projection portion 12*t*3 which consists of a part of the second case 12, and a substantially U shaped projection portion 30*t*3 which consists of a part of the peripheral part 30*a* of the connector 30. In the present Embodiment, the feature is given to the relation among the side walls at both sides of the groove portion 11*m*3, and the spacing width between the projection portion 12*t*3 and the projection portion 30*t*3.

As shown in FIG. 9, a spacing width s1 is defined as the interval between a side wall, at the perimeter side of the housing 10, of the substantially U shaped groove portion 11*m*3 which consists of a part of the first case 11, and a substantially U shaped projection portion 12*t*3 which consists of a part of the second case 12. Further, a spacing width s2 is defined as an interval between a substantially U shaped projection portion 30*t*3 which consists of a part of the peripheral part 30*a* of the connector 30, and the side wall, at the inner side of the housing 10, of the substantially U shaped groove portion 11*m*3 which consists of a part of the first case 11. In the drawing, an example is shown which satisfies s1<s2. Sealing material is filled up between spacings at the both sides, which are formed by spacings of the side walls of the substantially U shaped projection portion 12*t*3 and the substantially U shaped projection portion 30*t*3. Amid the spacing widths s1 and s2, either one of the spacing widths is made smaller than the other one.

The third seal part 43 consists of the substantially U shaped groove portion 11*m*3, and the substantially U shaped projection portions 12*t*3 and 30*t*3. Further, the third seal part consists of many component parts, as compared with the first seal part 41 and the second seal part 42. Therefore, due to the size variation of manufactured parts, and the variation in the amount of applied sealing material, the overhanging of sealing material is caused. In a case where the quantity of sealing material which is applied from a spacing is relatively large, the spacing with narrower interval receives a higher surface tension, where spacings are filled up with sealing material. And then, the overhanging of the sealing material can be prevented. The spacing width s1, which is located at the perimeter side of the housing 10, is made smaller than the spacing width s2 at the other side. Thereby, the sealing material is prevented from overflowing to the outside, and it becomes possible to prevent the swelling of the outermost form of the electronic device 100. By adopting the spacing width s2 at the connector 30 side, which is made smaller than the spacing width s1 at the other side, it becomes possible to prevent the adhesion of the sealing material to the external connection part of the connector 30, and fitting affinity can be secured.

In the Embodiments according to the present application, an exemplary case is explained where one connector is employed. However, even when the number of connectors is plural, the same configuration can be taken, and the same effect can be acquired. Moreover, an exemplary case is shown where the housing 10 is composed of two parts, that is, the first case 11 and the second case 12. However, even when each case is divided into plural parts, the same configuration can be taken, and the same effect can be acquired.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

EXPLANATION OF NUMERALS AND SYMBOLS

10 Housing; 11 First case; 11*a* Sole plate part; 11*b* Peripheral wall part; 11*h* Opening part; 11*t*1, 11*t*2 and 11*t*3 Projection portion, 11*m*1, 11*m*2 and 11*m*3 Groove portion; 11*w* Side wall; 12 Second case; 12*a* Top plate part; 12*b* Peripheral wall part; 12*t*1 and 12*t*3 Projection portion; 12*m*1 and 12*m*3 Groove portion; 12*u*3 Receptacle groove; 12*w*3 Receptacle wall; 20 Substrate; 21 Relay socket; 30 Connector; 30*t*2 and 30*t*3 Projection portion; 30*m*2 and 30*m*3 Groove portion; 30*a* Peripheral part; 31 Terminal; 41 First seal part; 42 Second seal part; 43 Third seal part; 50 Screw; 60 Sealing material; 100 Electronic device.

What is claimed is:

1. An electronic device, comprising
a substrate,
a connector connected to the substrate,
a first case which has an opening part, exposing a part of the connector to an outside, and
a second case which is joined with the first case, and seals and holds, inside a housing, a part of the connector and the substrate,
wherein the electric device has
a first seal part, including, between the first case and the second case, a groove portion prepared at one side and a projection portion prepared at another side, where those portions are joined by sealing material;
a second seal part, including, between the opening part of the first case and a peripheral part of the connector, a groove portion prepared at one side and a projection portion prepared at another side, where those portions are joined by the sealing material; and
a third seal part, including, among the first case, the second case, and the peripheral part of the connector, a groove portion prepared at one side and a projection portion prepared at another side, as a combination, or a projection portion prepared at one side and a groove portion prepared at another side, as a combination, where those portions are joined by the sealing material,
further wherein the first seal part, the second seal part, and the third seal part are connected.

2. The electronic device according to claim 1,
wherein the third seal part includes a combined part, which is formed in the groove portion of the first case, where the projection portion of the second case and the projection portion of the peripheral part of the connector are combined and joined together by the sealing material.

3. The electronic device according to claim 2,
wherein, at least in a part of the third seal part, a side wall at one side of the groove portion of the first case is longer than a side wall at another side.

4. The electronic device according to claim 2,
wherein, at least in a part of the third seal part, amid a spacing width between the projection portion of the second case and a side wall of the groove portion of the first case, and a spacing width between the projection portion of the peripheral part of the connector and the side wall of the groove portion of the first case,
a spacing width at one side is smaller than a spacing width at another side.

5. The electronic device according to claim 1,
wherein the third seal part includes a combined groove portion, which is formed of a part of the groove portion of the second case and a part of the groove portion of the peripheral part of the connector, where the combined groove portion is combined and joined together with the projection portion of the first case by the sealing material.

6. The electronic device according to claim 5,
wherein, in a part of the second case, a receptacle groove portion of the sealing material is prepared at least at a part of a seamed part, which faces the combined groove portion of the third seal part, where the combined groove portion is formed of a part of the groove portion of the second case and a part of the groove portion of the peripheral part of the connector.

7. The electronic device according to claim 5,
wherein, in a part of the second case, a receptacle wall of the sealing material is prepared at least at a part of a seamed part, which faces the combined groove portion of the third seal part, where the combined groove portion is formed of a part of the groove portion of the second case and a part of the groove portion of the peripheral part of the connector.

8. The electronic device according to claim 1,
wherein the first seal part, the second seal part, and the third seal part have waterproofing structure, in which those seal parts are filled up with the sealing material.

9. The electronic device according to claim 8,
wherein the first seal part, the second seal part, and the third seal part are continuously connected together, so as to allow a single stroke writing.

10. The electronic device according to claim 9,
wherein the first seal part, the second seal part, and the third seal part are arranged on a same plane.

11. The electronic device according to claim 10,
wherein the third seal part includes a combined part, which is formed in the groove portion of the first case, where the projection portion of the second case and the projection portion of the peripheral part of the connector are combined and joined together by the sealing material.

12. The electronic device according to claim 11,
wherein, at least in a part of the third seal part, a side wall at one side of the groove portion of the first case is longer than a side wall at another side.

13. The electronic device according to claim 11,
wherein, at least in a part of the third seal part, amid a spacing width between the projection portion of the second case and a side wall of the groove portion of the first case, and a spacing width between the projection portion of the peripheral part of the connector and the side wall of the groove portion of the first case,
a spacing width at one side is smaller than a spacing width at another side.

14. The electronic device according to claim 10,
wherein the third seal part includes a combined groove portion, which is formed of a part of the groove portion of the second case and a part of the groove portion of the peripheral part of the connector, where the combined groove portion is combined and joined together with the projection portion of the first case by the sealing material.

15. The electronic device according to claim 14,
wherein, in a part of the second case, a receptacle groove portion of the sealing material is prepared at least at a part of a seamed part, which faces the combined groove portion of the third seal part, where the combined groove portion is formed of a part of the groove portion of the second case and a part of the groove portion of the peripheral part of the connector.

16. The electronic device according to claim 14,
wherein, in a part of the second case, a receptacle wall of the sealing material is prepared at least at a part of a seamed part, which faces the combined groove portion of the third seal part, where the combined groove portion is formed of a part of the groove portion of the second case and a part of the groove portion of the peripheral part of the connector.

* * * * *